US007116790B2

(12) United States Patent
Heron et al.

(10) Patent No.: US 7,116,790 B2
(45) Date of Patent: Oct. 3, 2006

(54) LOUDSPEAKER

(75) Inventors: Kenneth H Heron, Farnborough (GB); Malcolm Nash, Farnborough (GB); Andrew P Payne, Farnborough (GB)

(73) Assignee: QinetiQ Limited, Farnborough (GB)

( * ) Notice: Subject to any disclaimer, the term of this patent is extended or adjusted under 35 U.S.C. 154(b) by 0 days.

(21) Appl. No.: 10/467,316

(22) PCT Filed: Feb. 4, 2002

(86) PCT No.: PCT/GB02/00483

§ 371 (c)(1),
(2), (4) Date: Aug. 6, 2003

(87) PCT Pub. No.: WO02/063604

PCT Pub. Date: Aug. 15, 2002

(65) Prior Publication Data

US 2004/0066938 A1 Apr. 8, 2004

(30) Foreign Application Priority Data

Feb. 6, 2001 (GB) ................................ 0102864.6

(51) Int. Cl.

| | |
|---|---|
| ***H04R 29/00*** | (2006.01) |
| ***H04R 25/00*** | (2006.01) |
| ***H03G 5/00*** | (2006.01) |
| ***H03G 9/00*** | (2006.01) |
| ***H03G 3/00*** | (2006.01) |

(52) U.S. Cl. ............................ 381/59; 381/98; 381/99; 381/102; 381/107; 381/150

(58) Field of Classification Search .................. 381/58, 381/59, 98, 99, 116, 117, 150, 152
See application file for complete search history.

(56) References Cited

U.S. PATENT DOCUMENTS

| | | | | |
|---|---|---|---|---|
| 4,052,560 | A * | 10/1977 | Santmann | 381/98 |
| 6,332,029 | B1 * | 12/2001 | Azima et al. | 381/152 |
| 6,731,764 | B1 * | 5/2004 | Asada et al. | 381/152 |
| 2002/0191807 | A1 * | 12/2002 | Asada et al. | 381/335 |
| 2003/0063761 | A1 * | 4/2003 | Hibowicki | 381/111 |
| 2004/0052386 | A1 * | 3/2004 | Heron et al. | 381/152 |

FOREIGN PATENT DOCUMENTS

| | | | |
|---|---|---|---|
| DE | 43 43 807 | A | 6/1995 |
| EP | 1 063 866 | A | 12/2000 |
| WO | 97/09842 | A1 | 3/1997 |
| WO | 99/08479 | A | 2/1999 |
| WO | 00/05920 | A | 2/2000 |

* cited by examiner

*Primary Examiner*—Laura A. Grier
(74) *Attorney, Agent, or Firm*—Nixon & Vanderhye P.C.

(57) ABSTRACT

Conventional analog loudspeakers have a limited dynamic range as compared to the available dynamic range of digital recordings. Digital recordings use up to 24 bits and this implies a dynamic range of 141 dB. Digital loudspeakers, involving $2^N$ single bit devices (with N=24, this number is $1.7\times10^7$) have been proposed. The present improvement is the provision of at least one loudspeaker, a plurality of analog drivers and the audio input supplied to a control processor which in turn drives one or more of the plurality of independent analog drivers. The number of drivers in operation at any one time is determined by the amplitude of the input audio signal to the control processor.

22 Claims, 7 Drawing Sheets

Type 3 Algorithm, Without Exponential Smoothing

LOUDSPEAKER

This application is the U.S. national phase of international application PCT/GB02/00483 filed 4 Feb. 2003, which designated the U.S.

BACKGROUND OF THE INVENTION

1. Field of the Invention

This invention relates to loudspeakers and in particular to loudspeakers with improved dynamic range as compared to existing loudspeakers.

2. Discussion of Prior Art

Conventional (or single input) loudspeaker systems can be defined as systems in which the master drive signal may be passed to a plurality of drivers, but for which, at any particular frequency the relationship between the signals passed to each driver is fixed. A driver in this context could mean an electro-magnetic induction coil (as used in conventional loudspeakers) or a piezo-electric pad or any other device that can cause a panel-form loudspeaker or a loudspeaker cone to move.

FIG. 1 shows a conventional loudspeaker system comprising three drivers/loudspeakers 1, 2, 3. A master signal 4 is split by filters 5, 6 and 7 (high pass filter, band pass filter and low pass filter respectively) into three frequency ranges, treble 5*a* which goes to speaker 1, mid-range 6*a* which goes to speaker 2 and bass 7*a* which goes to speaker 3. This represents a multiple speaker system in which there is a frequency split of the main master drive signal 4. The relationship between each of the drivers 1, 2 and 3 is fixed and is not dependent on the level of the master signal.

Conventional analogue loudspeakers have a limited dynamic range as compared to the available dynamic range of the latest digital recordings (for example 24 bit or DSD). Digital recordings use up to 24 bits and this implies a dynamic range of 141 dB. Digital loudspeakers, involving $2^N$ single bit devices (with N=24, this number is $1.7\times10^7$) have been proposed—see WO96/31086. However, these suffer from obvious complexity and poor performance associated with the interaction effects between the different devices, which have discouraged widespread use of such systems. A further problem is the inability of most loudspeakers to reproduce realistic absolute levels of sound (up to say 120 dB at 1 m without distortion), so such digital loudspeakers cannot take full advantage of the 24-bit fidelity.

A conventional loudspeaker system, such as that shown in FIG. 1, will suffer distortion and other detrimental effects if the dynamic range supplied to any of the drivers/loudspeakers 1, 2 or 3 exceeds much more than 100 dB. Note, although conventional speakers can be constructed to have a dynamic range of approaching 120 dB they are very expensive. More usually the dynamic range of a conventional speaker is in the region of 100 dB.

SUMMARY OF THE INVENTION

It is therefore an object of the present invention to provide a loudspeaker system, which overcomes or at least mitigates the above-mentioned problems with prior art systems.

Accordingly this invention provides a "multiple input loudspeaker system" (as herein defined) comprising one or more loudspeakers and a plurality of analogue drives arranged in use to drive the one or more loudspeakers wherein, in use, the one or more loudspeakers are input a drive signal having a time varying signal level and, at any particular time, the signal level measured at the input to the loudspeaker system determines the operational state of each of the drivers.

A "multiple input loudspeaker" may be made up from a plurality of conventional analogue loudspeakers or alternatively from a panel-form loudspeaker, sometimes referred to as a flat panel loudspeaker or a multi-mode radiator, having a plurality of analogue drivers.

A "multiple input loudspeaker" is not a conventional multiple channel loudspeaker system (used for example in surround sound or stereo sound systems) although it could be applied to such a multiple channel system.

"Multiple input loudspeaker" systems in contrast may be defined as systems in which a master drive signal is devoted into a plurality of signals which are applied to a plurality of drivers but for which at any particular frequency, the relationship between the signals passed to each driver depends on the level of the master signal. This distinction is illustrated in FIGS. 1 and 2.

The plurality of analogue drivers can be connected to conventional speakers or more conveniently the plurality of drivers can drive a single panel-form loudspeaker.

Panel-form loudspeaker technology is able to take advantage of digital fidelity because it is able to inherently produce very high absolute levels of sound. By using a panel-form loudspeaker combined with a plurality of analogue drivers or exciters it is possible to overcome the problems of complexity, interaction effects and loudness which limit the benefits of existing solutions. Prior art devices have suggested the use of more than one driver for a single loudspeaker, but none of them have recognised the need to control how these drivers interact to obtain the benefits of the present invention.

Since the loudest elements of music signals tend to occur at the lowest frequencies, the width of the window can be chosen to properly produce the necessary low frequency signals whilst avoiding rapid changes in gain to each loudspeaker.

Preferably, at very low levels only one driver is activated and at very high levels all drivers are activated, and the sum of all the driver outputs equals the required signal outputs at all times.

DETAILED DISCUSSION OF EMBODIMENTS

At low frequencies the acoustic pressures produced by the action of each active driver will tend to add in a linear fashion. In order to ensure that the combined output from all drivers is correct a control signal can conveniently be applied to the linear time signal to maintain the sum of the linear time output equal to the required signal output.

In contrast, at high frequencies the acoustic pressures produced by the action of each active driver will add in a power manner. Therefore in order to ensure that the combined power output is correct a control signal can conveniently be applied to a suitable squared time signal such that the sum of the acoustic power output is equal to the desired power output. This is beneficial at the higher frequencies where drivers tend to act independently of one another.

Preferably, the controller operates in both linear and power signals, such that at low frequencies the controller maintains the linear sum, whilst at high frequencies the controller maintains the power sum. This arrangement covers a wide frequency range.

BRIEF DESCRIPTION OF THE DRAWINGS

Embodiments of the loudspeaker system according to the present invention will now be described with reference to the accompanying drawings in which:

Note: throughout all the Figures like numerals are used to denote like features.

FIG. 1 as described above represents a conventional loudspeaker system. FIG. 2 shows a multiple input loudspeaker system covered by the invention comprising a number of drivers 10*a*, 10*b*, 10*c*, 10*d* . . . 10*n*, which receive their input from a master signal 8. Note, this master signal could be the same as master signal 4 in FIG. 1 or it could represent one of the channels 5*a*, 6*a* or 7*a* or any other aspect of an audio system.

Each master signal 8, see FIG. 2, is a time varying data steam, and it is this varying amplitude level that determines the signal sent to each driver 10*a* . . . 10*n*. By choosing suitable factors in the calculation of the drive signals for each driver it is possible to make sure that no driver is overloaded and each will operate within its linear dynamic range with low distortion. Irrespective of the choice of loudspeaker (i.e. panel-form or conventional) there are a number of alternative algorithms by which the analogue drivers can be controlled.

Figure 3:
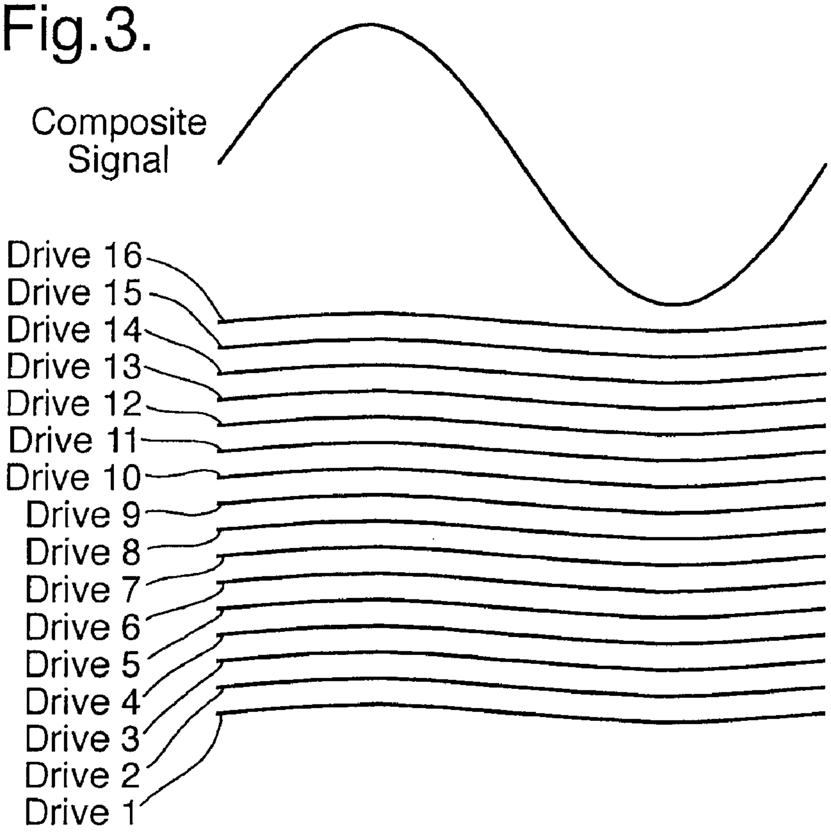
FIG. 3 illustrates an algorithm (=algorithm 1) to control operation of a loudspeaker according to the present invention.

In a first algorithm, an oversampling method is used. The signal to each driver is determined at each digital data point using INT $\{(x+k)/n\}$ for the kth driver, $0 \leqq k<n$, where x is the basic signal level expressed as a signed integer, n is the number of drivers and INT$\{\ \}$ implies the lowest integer part of. This algorithm is shown in FIG. 3 for a full level sine wave with 16 drivers. This algorithm is complex, but overcomes most problems associated with the use of conventional loudspeakers for digital recordings, because all drivers are always activated and all drivers use substantially the same waveform as shown in FIG. 3.

Alternatively, in a second algorithm, a first driver is activated and driven until the signal level reaches a first predetermined level; a second driver is activated when the signal level reaches the first predetermined level; and subsequent divers are activated as the signal level reaches subsequent respective predetermined levels; whereby all activated drivers share load equally at all activated levels.

Figure 4:
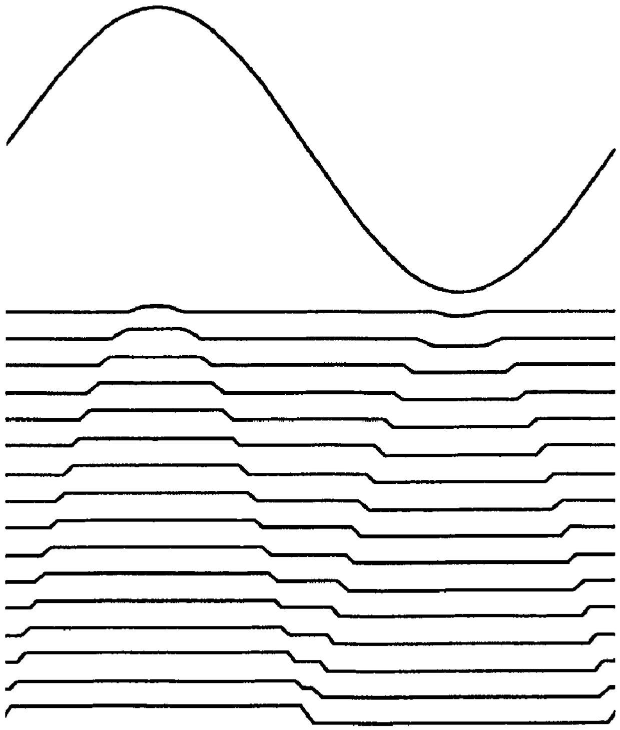
FIG. 4 illustrates an algorithm (=algorithm 3) to control operation of a loudspeaker according to the present invention.

Alternatively, in a third algorithm, a first driver is driven until the signal level reaches a first predetermined level, wherein a second driver is activated as the signal level reaches the first predetermined level; wherein subsequent drivers are activated as the signal level reaches subsequent respective predetermined levels; whereby each newly activated driver takes the load required and all other activated drivers are saturated. This algorithm is shown in FIG. 4 for a full level sine wave with 16 drivers.

For Algorithm 1 all drivers are activated at all signal levels. Algorithms 2 and 3 have the advantage that at low signal levels only a single driver is activated, thus potentially giving higher quality sound at such levels than would be the case with algorithm 1. Algorithm 3 has the advantage of only having signal gradient discontinuities at the change over levels—thus reducing unwanted transient switching problems.

Preferably for algorithms 2 and 3, an exponential or other smoothing function is applied to the control signal for each newly activated driver such that the addition of a new driver to all the other activated drivers is achieved in a continuous manner.

Algorithms 2 and 3 can be considered as producing drive signals with effective time-varying gain. However, rapid changes in the gain associated with each driver can cause undesirable non-linear distortion effects and therefore a still further way of controlling the drivers is to control the rate at which the gain to each driver changes so that it is changed in a smooth fashion. Therefore, preferably, a smoothing function is first applied to the master drive signal at the input to the loudspeaker. The smoothed drive signal can then be used to calculate the number of operational drivers required.

Figure 5A:
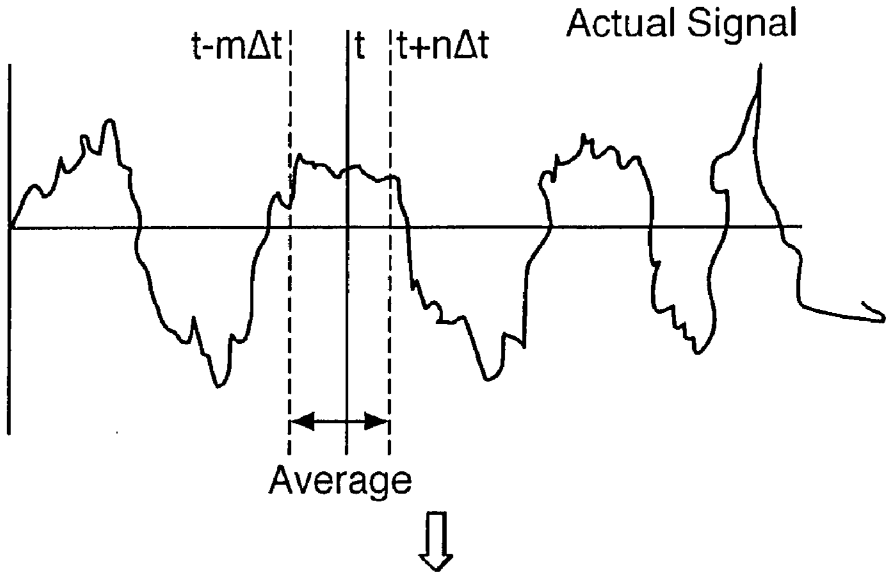
FIG. 5 illustrates the sliding boxcar averaging process to determine the controlling master amplitude, according to the present invention.
Figure 5B:
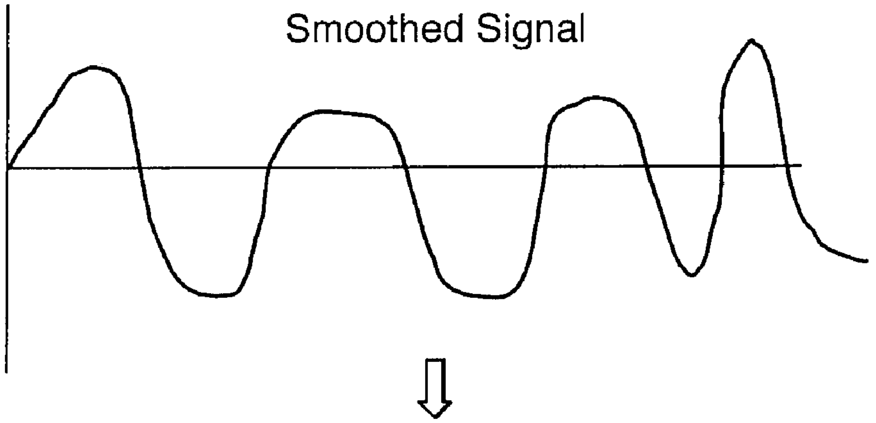

A window, such as a sliding boxcar, can be employed successfully in this “smoothing” role. Whereby, the gain applied to each driver is based on the weighted average signal measured as the mean across a number of samples which encompass points both in the future and the past, relative to the current time sample of the master drive signal. Thus, for any time t, the gain is calculated from a weighted mean signal between the times $t-m\Delta t$ and $t+n\Delta t$, where $\Delta t$ is the time between individual signal samples and m and n are integers. These integers may be equal or may be chosen to favour either the past or future portions of the signal. The total duration of the window $(m+n)\ \Delta t$ effectively controls the rate at which the gain to each driver changes. This smoothing box-car function is illustrated in FIG. 5 wherein an initially rapidly changing signal in FIG. 5*a* is smoothed by the action of the box car function into the smooth signal of FIG. 5*b*.

Figure 1:
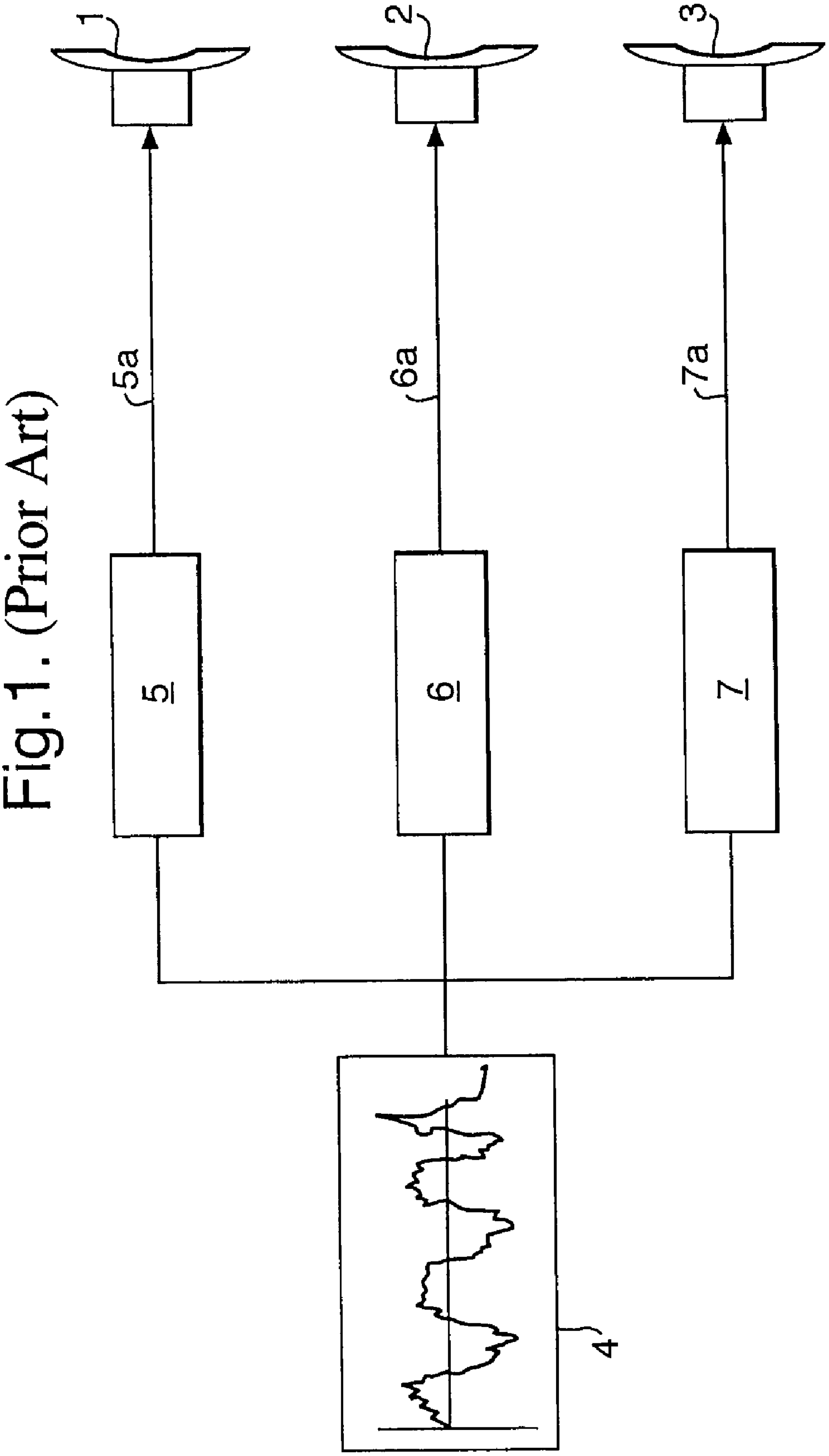
Fig.1. (Prior Art)
FIG. 1 illustrates a conventional multi-channel loudspeaker system.
Figure 2:
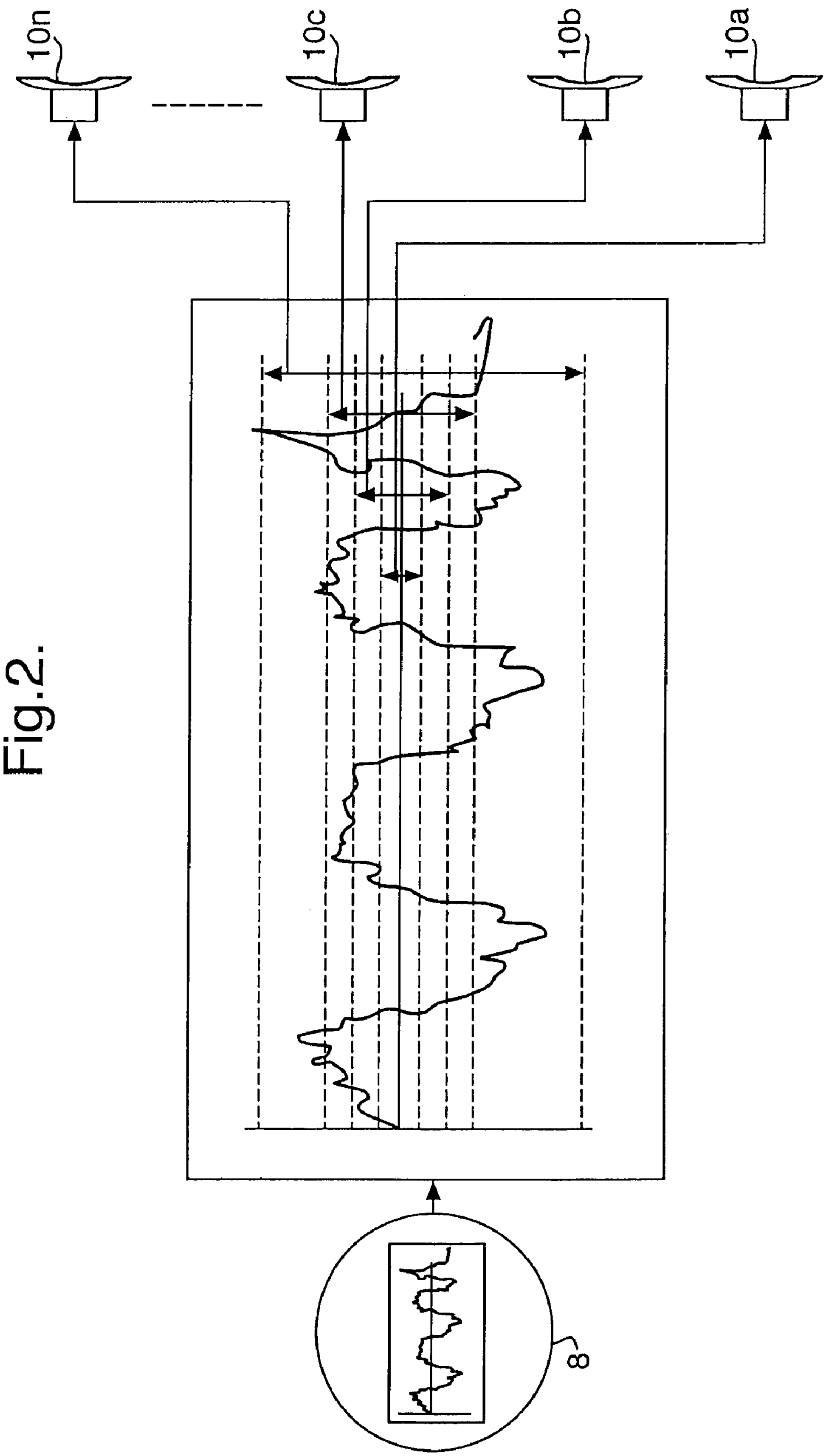
FIG. 2 illustrates a multiple-input loudspeaker system according to the invention.
Figure 6:
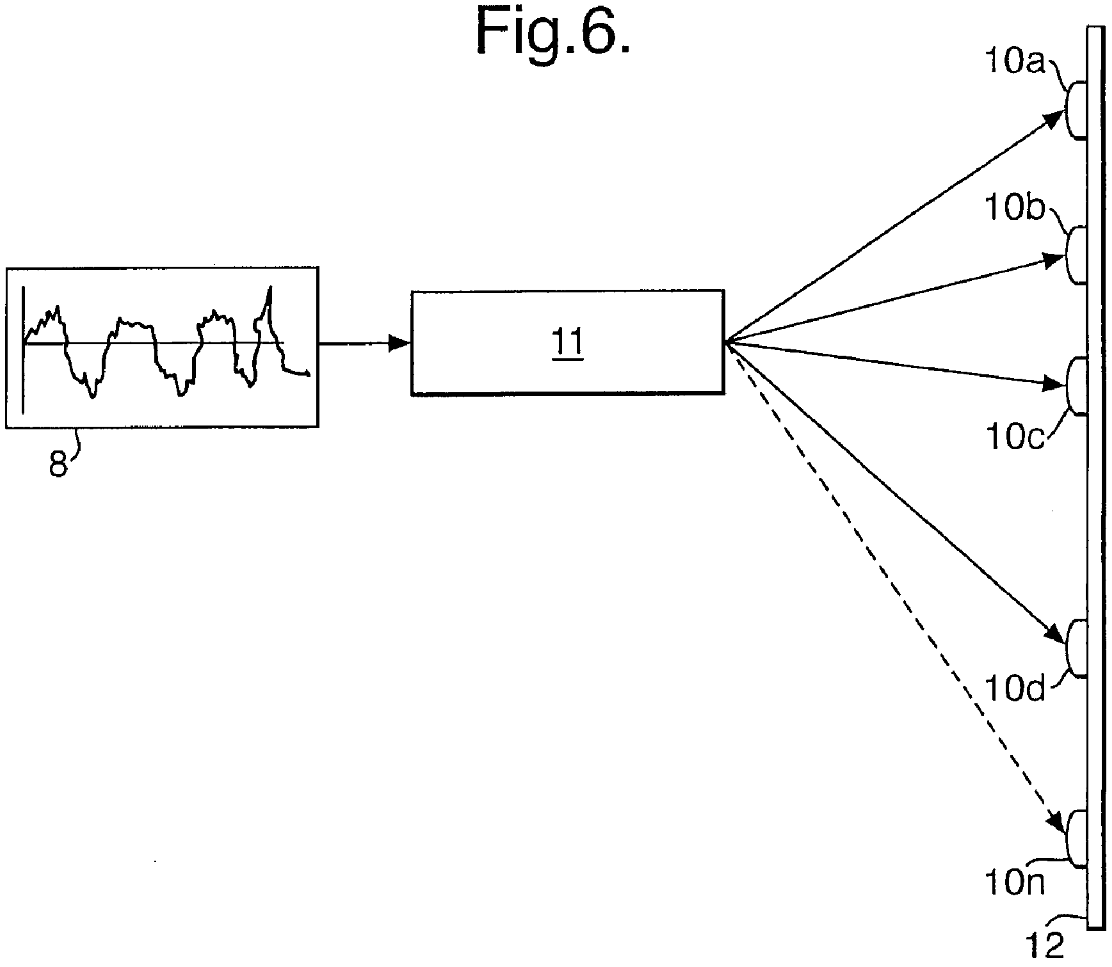
FIG. 6 is a block diagram of a panel-form loudspeaker in accordance with the present invention.

FIG. 6 shows one example of a panel-form loudspeaker according to the present invention. A signal, for example from an amplifier (not shown) is input to a control processor 11. The output of the control processor 11 modifies the operation of one or more drivers 10, which are attached to a radiator panel 12 and when operated excite a multi mode response of the panel (Note: this arrangement is equivalent to the one shown in FIG. 2, i.e. there are a number of drivers 10*a* . . . 10*n*. The only difference is the speaker technology used, conventional speakers in FIG. 2 and a panel form loudspeaker in FIG. 6).

Figure 7:
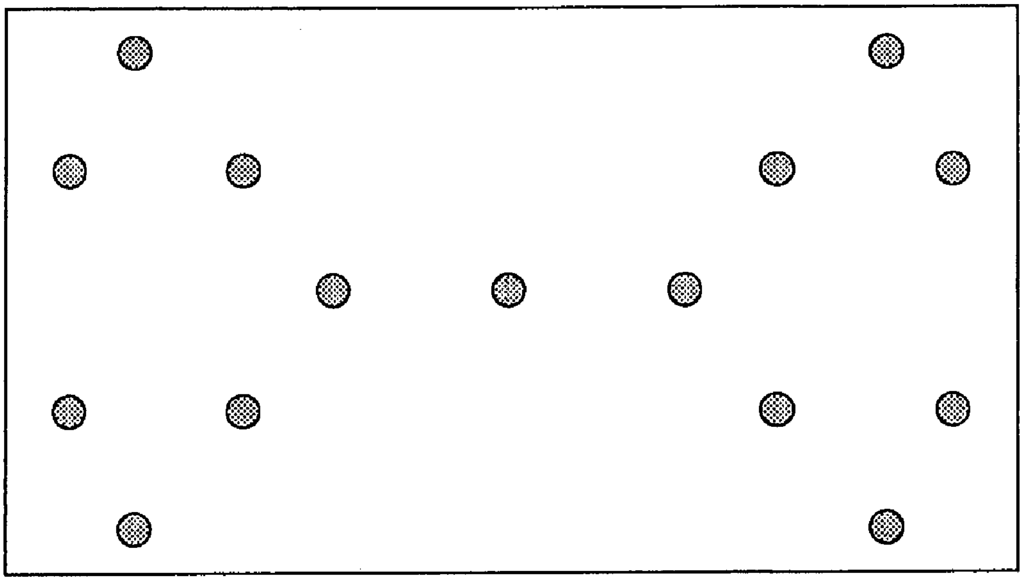
FIG. 7 illustrates one example of a radiator and drivers for a panel-form loudspeaker in accordance with the present invention.
Figure 8:
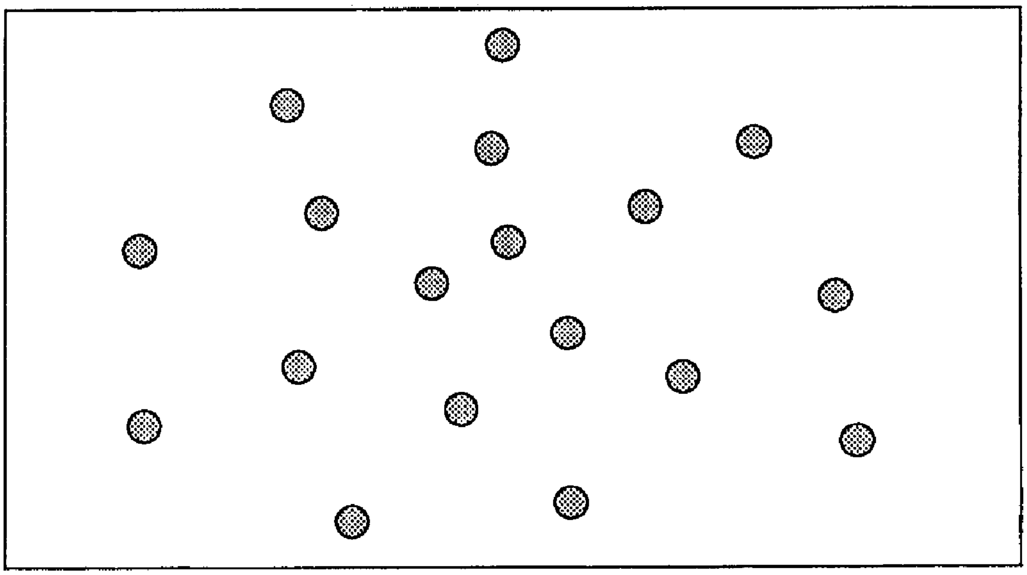
FIG. 8 illustrates another example of a radiator and drivers for a panel form loudspeaker in accordance with the present invention.

The panel is provided with a plurality of drivers, which are arranged across the panel. The arrangement of multiple drivers aims to excite all modes of the panel and to avoid interactions with each other. This can be achieved using a spiral starting just off-centre or an irregular pattern, both producing driver locations spread throughout the panel. Alternatively, drivers may be arranged in a more regular manner, either concentrated at the centre or spread across the panel. This is still effective because the panels themselves tend to be slightly irregular when manufactured. FIGS. 7 and 8 illustrate two arrangements of multiple drivers, although others are possible.

In use, the panel-form loudspeaker of the present invention is operated by the control processor comparing the input or base signal with a set of known criteria and then controlling the operation of the drivers in response to this. For example, an oversampling method can be used. The signal to each driver 10 is determined at each digital data point using INT{(x+k)/n} for the kth driver, $0 \leqq k < n$, where x is the basic signal level expressed as a signed integer, n is the number of drivers and INT{ } implies the lowest integer part of. This algorithm is shown in FIG. 3 for a full level sine wave with 16 drivers. This example has the advantage that all drivers use substantially the same waveform as shown in FIG. 3.

In a second example, one driver 10*a* is always driven and for levels of the base signal, which fall within its dynamic range, this is the only driver activated. When the level of the signal goes above this, another driver 10*b* is switched on such that both now share the load equality (i.e. at changeover the signal to the original driver is halved and this same half signal is sent to the second driver). When the level exceeds that which can be accommodated by two drivers, a further driver 10*c* will be switched on such that all three now share the load equally and so on until all drivers are in use. This particular embodiment can suffer from a problem of significant transients and distortions occurring at changeover, but it has the advantage of being particularly easy to implement.

In a third example, one driver 10*a* is always driven and for levels of the base signal which fall within its dynamic range this is the only driver activated. When the level of the signal goes above this, another driver 10*b* is switch on to add to the first driver 10*a*, but the first driver 10*a* is left saturated such that at the changeover the second driver 10*b* is at its minimum level. When the level exceeds that which can be accommodated by two drivers, a further driver 10*c* will be switched on and so on until all drivers are in use. This algorithm is shown in FIG. 4 for a full level sine wave with 16 drivers. This third example has the advantage of only having signal gradient discontinuities at the change over levels—thus reducing unwanted transient switching problems.

The type of input signal used by the control processor to control the drivers is dependent on the frequency. At low frequencies, e.g. below 300 Hz, use of linear signals is preferred because the whole panel moves in monophase and at higher frequencies, e.g. greater than 500 Hz, power signals are preferred because multi-modal resonances are excited in the radiator as described in EP0541646. In the crossover region between 300 Hz and 500 Hz, the signals will be partially linear and partially power signal. The invention applies to any size of loudspeaker. However, at the low frequency end there may need to be a minimum size to obtain the benefits of the present invention.

Figure 9:
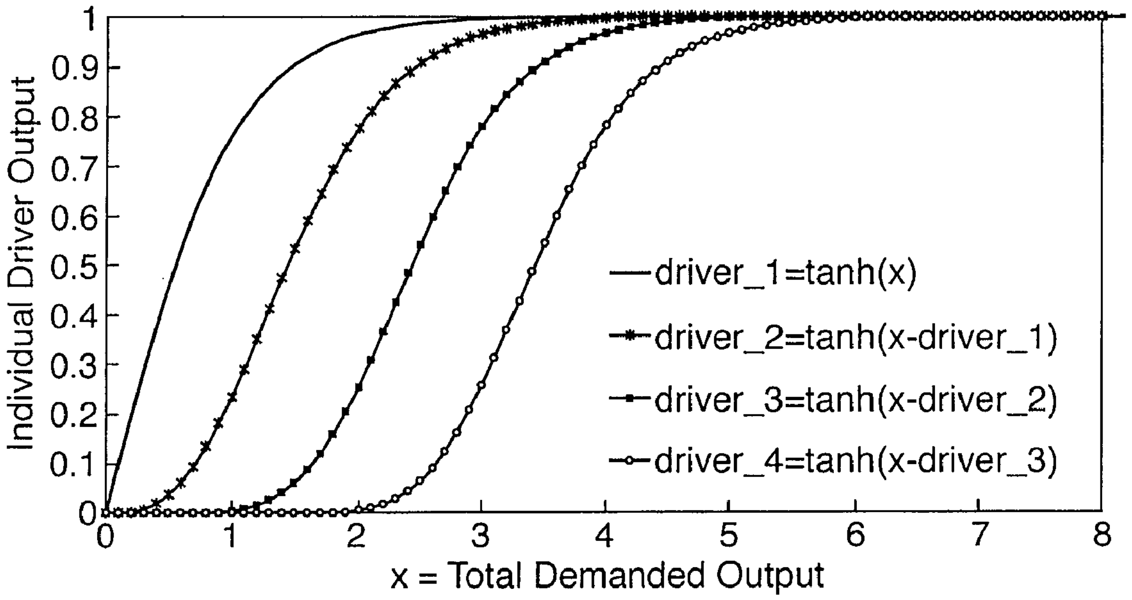
FIGS. 9 and 10 illustrate a suitable smoothing function (for use with algorithm 3) to apply to each driver such that new drivers are brought in smoothly.
Figure 10:
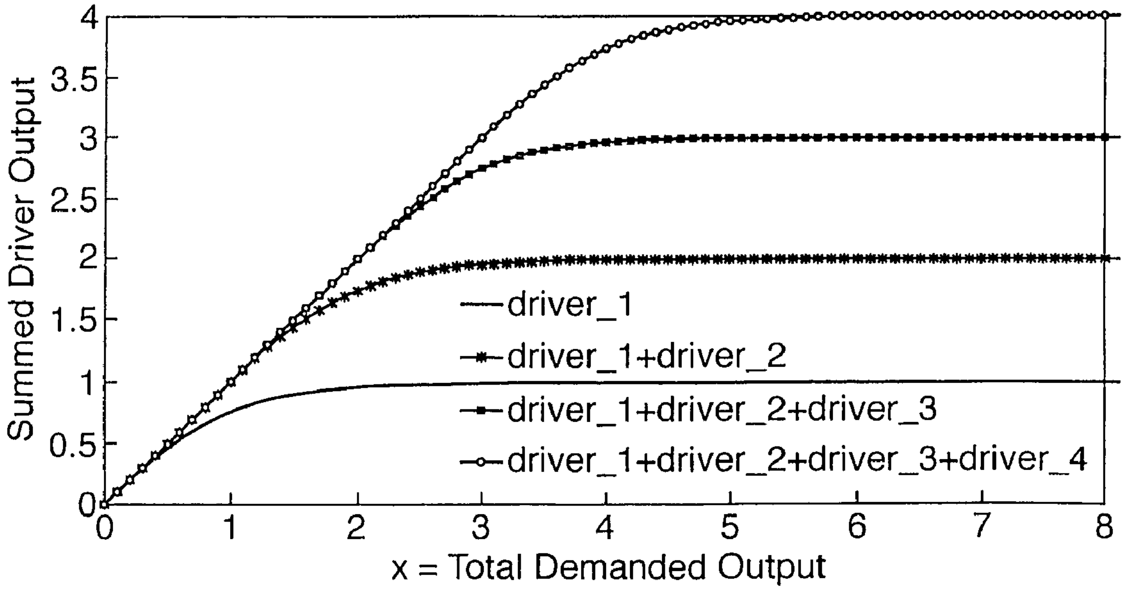

A further improvement is to apply a smoothing function to the control signal applied to each newly activated driver, so that the new driver is brought in in a continuous manner, rather than a step change. An example of a suitable smoothing function is a tanh function as shown in FIG. 9 for four drivers. As a new driver is added, the signals combine smoothly until the total required level is reached, as illustrated by FIG. 10.

In a fourth example (see FIG. 5) the gain associated with the signal for each driver is smoothed in the time domain using a moving, short duration averaging algorithm. This smoothed amplitude signal is used as the master control to decide the gain of each driver. In essence, each driver receives the original waveform but at a level controlled by the smoothed level of the original waveform.

Figure 5C:
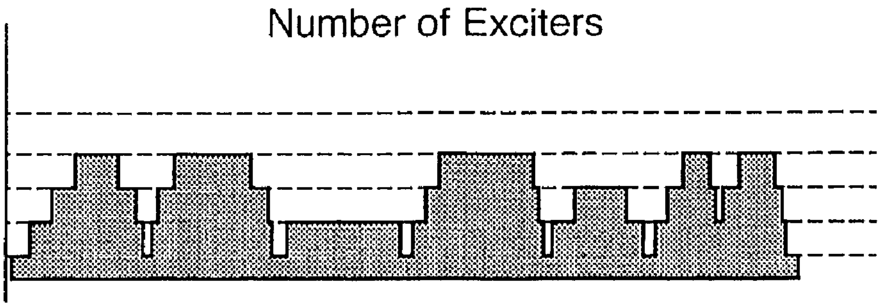

This example is illustrated in FIG. 5. An input signal is depicted in FIG. 5 as having a rapidly changing level. Controlling the drivers based on this drive signal could cause non-linear distortion effects and so a boxcar smoothing function is applied to the signal in order to produce the smooth signal depicted in FIG. 5*b*. This smooth signal can now be used to determine the number of drivers to be used. In this case the aforementioned algorithm 3 is used and subsequent drivers are activated as the signal level reaches subsequent respective predetermined levels (see FIG. 5*c*). An exponential smoothing function has not been applied in this instance.

Another feature of the invention is to drive a single panel-form loudspeaker with a number of drivers, possibly identical. The drivers are activated to simulate a conventional loudspeaker i.e. more are driven for low frequency signals than for high frequency signals, in order to be able to handle the required power. Signals to the drivers could be the same, but a digital filter in front of each driver would control the frequency range over which each is driven. A computer could manipulate the filter cut off and gain. This would allow the system to be tailored for different room settings and for the drivers to be switched on and off according to the absolute power levels required.

Figure 11:
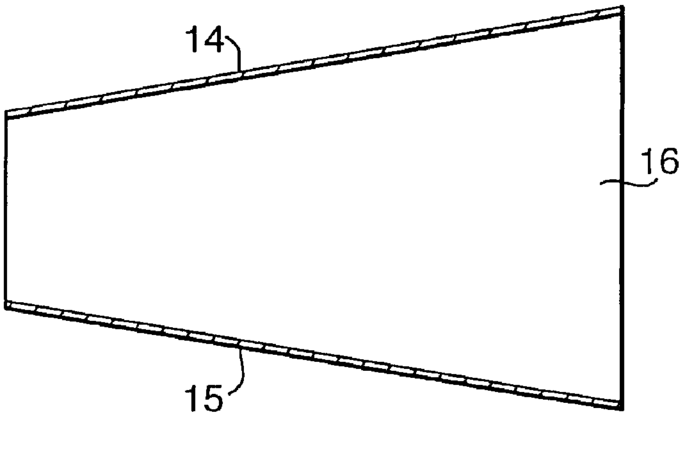
FIG. 11 illustrates an alternative structure of panel-form loudspeaker in accordance with the present invention.

In order to further improve the loudspeaker performance, the panel may be constructed in a tapered form as shown in FIG. 11. The panel has a sandwich structure, so that it operates in a region above acoustic coincidence for the greater part of the frequency range. Hence, the coincidence frequency varies according to panel position. Two skins 14, 15 are positioned either side of a cellular core 16. The core may be a honeycomb or other cellular structure.

The invention claimed is:

1. A multiple input loudspeaker system comprising:

at least one loudspeaker;

a plurality of analog drivers for driving the at least one loudspeaker; and a control processor, responsive to an input signal, for providing the plurality of analog drivers with a drive signal, said drive signal having a time varying signal level and wherein the operation of each of said drivers is independently controlled in response to the amplitude of said input signal level in a given frequency range.

2. A multiple input loudspeaker system as claimed in claim 1 wherein the plurality of analog drivers drive a plurality of conventional loudspeakers.

3. A multiple input loudspeaker system as claimed in claim 1 wherein the plurality of analog drivers drive a panel-form loudspeaker.

4. A multiple input loudspeaker system according to claim 1, wherein all drivers are driven and the signal level input to each driver is the lowest integer part of the basic signal level expressed as a signed integer plus the number of the drive in question, over the total number of drivers.

5. A multiple input loudspeaker system according to claim 1, wherein a first driver is activated and driven until the signal level reaches a first predetermined level; wherein a second driver is activated when the signal level reaches the first predetermined level; and wherein subsequent drivers are activated as the signal level reaches subsequent respective predetermined levels; whereby all activated drivers share load equally at all activated levels.

6. A multiple input loudspeaker system according to claim 1, wherein a first driver is driven until the signal level reaches a first predetermined level, wherein a second driver is activated as the signal level reaches the first predetermined level; wherein subsequent drivers are activated as the signal level reaches subsequent respective predetermined levels; whereby each newly activated driver takes the load required and all other activated drivers are saturated.

7. A multiple input loudspeaker system according to claim 5 wherein the addition of a new driver is achieved in a continuous manner by applying an exponential or other smoothing function to the signal sent to the drivers.

8. A multiple input loudspeaker system according to claim 1 wherein at very low levels of said drive signal only one driver is activated and at very high levels of said drive signal all drivers are activated; and wherein the sum of all the driver outputs equals the required signal outputs at all times.

9. A multiple input loudspeaker system according to claim 1 wherein a control signal proportional to the amplitude of the drive signal determines the signal level applied to each driver.

10. A multiple input loudspeaker system according to claim 1 wherein a control signal proportional to the square of the amplitude of the drive signal determines the signal level applied to each driver.

11. A multiple input loudspeaker system according to claim 1 wherein the control signal from a controller operates in both linear and power signals, such that at low frequencies the controller maintains a linear sum whilst at high frequencies the controller maintains a power sum.

12. A loudspeaker system for translating a master electrical signal into acoustic energy, said system comprising:

at least one loudspeaker, a plurality of loudspeaker driven for translating respective electrical signals into acoustical movement of said at least one loudspeaker; and a controller, responsive to said master electrical signal, for providing an electrical output to each of said drivers, wherein the amplitude of the master signal determines the signal supplied to each of said drivers.

13. A multiple input loudspeaker system as claimed in claim 12 wherein the plurality of analog driven drive a plurality of conventional loudspeakers.

14. A multiple input loudspeaker system as claimed in claim 12 wherein the plurality of analog drivers drive a panel-form loudspeaker.

15. A multiple input loudspeaker system according to claim 12, wherein all drivers are driven and the signal level input to each driver is the lowest integer part of the basic signal level expressed as a signed integer plus the number of the drive in question, over the total number of drivers.

16. A multiple input loudspeaker system according to claim 12, wherein a first driver is activated and driven until the signal level reaches a first predetermined level; wherein a second driver is activated when the signal level reaches the first predetermined level; and wherein subsequent drivers are activated as the signal level reaches subsequent respective predetermined levels; whereby all activated drivers share load equally at all activated levels.

17. A multiple input loudspeaker system according to claim 16, wherein the addition of a new driver is achieved in a continuous manner by applying an exponential or other smoothing function to the signal sent to the drivers.

18. A multiple input loudspeaker system according to claim 12, wherein a first driver is driven until the signal level reaches a first predetermined level, wherein a second driver is activated as the signal level reaches the first predetermined level; wherein subsequent drivers are activated as the signal level reaches subsequent respective predetermined levels; whereby each newly activated driver cakes the load required and all other activated drivers are saturated.

19. A multiple input loudspeaker system according to claim 12, wherein at very low signal levels of said master electrical signal only one driver is activated and at very high signal levels of said master electrical signal all driven are activated; and wherein the sum of all the driver outputs equals the required signal outputs at all times.

20. A multiple input loudspeaker system according to claim 12, wherein said controller applies a control signal proportional to the master electrical signal to maintain the sum of the driver outputs equal to a desired loudspeaker output.

21. A multiple input loudspeaker system according to claim 12, wherein said controller applies a control signal to a suitable squared time signal derived from said master electrical signal such that the sum of the loudspeaker acoustic power output is equal to a desired power output.

22. A multiple input loudspeaker system according to claim 12, wherein the electrical output from said controller operates in both linear and power signals, such that at relatively low frequencies the controller maintains a linear sum output whilst at relatively high frequencies the controller maintains a power sum output.

* * * * *